United States Patent [19]

Keller et al.

[11] 4,385,966
[45] May 31, 1983

[54] FABRICATION OF THIN FILM RESISTORS AND CAPACITORS

[75] Inventors: Harry N. Keller, Center Valley; Joseph M. Morabito, Bethlehem; Raymond C. Pitetti, Wescosville, all of Pa.

[73] Assignee: Bell Telephone Laboratories, Incorporated, Murray Hill, N.J.

[21] Appl. No.: 194,881

[22] Filed: Oct. 7, 1980

[51] Int. Cl.³ .................... C25D 11/02; C25D 11/18
[52] U.S. Cl. ................... 204/15; 204/37 R; 204/38 A
[58] Field of Search ............ 204/15, 38 A, 37 R

[56] References Cited

U.S. PATENT DOCUMENTS 2,766,509 10/1956 Le Loup ..................... 204/37 R
3,607,679 9/1971 Melroy ........................... 204/15
3,718,565 2/1973 Pelletier ........................ 204/192
4,251,326 2/1981 Arcidiacono .................. 204/38 A

FOREIGN PATENT DOCUMENTS 595365 12/1947 United Kingdom ............ 204/37 R

OTHER PUBLICATIONS

Thermodynamic Properties of Steam, Keenan and Keyes, 1st Ed., John Wiley and Sons, pp. 23-33.

Primary Examiner—T. M. Tufariello
Attorney, Agent, or Firm—Lester H. Birnbaum

[57] ABSTRACT

Disclosed is a method for fabricating a circuit including thin film resistors (15) and capacitors (12, 13, 14, 16) on a single substrate whereby stabilization is effected after all such components are completely formed. A high pressure steam atmosphere is utilized for stabilization so that the resistors can be stabilized at lower temperatures and/or times and the capacitors are not degraded.

6 Claims, 9 Drawing Figures

FABRICATION OF THIN FILM RESISTORS AND CAPACITORS

BACKGROUND OF THE INVENTION

This invention relates to thin film circuit fabrication, and in particular to a method for fabricating resistors and capacitors on a single substrate.

Fabrication of thin film resistors and capacitors on a single insulating substrate has been known for many years. Typically, the resistors comprise a layer of tantalum nitride which is deposited by sputtering, followed by chemical etching to form the desired pattern. The capacitors are typically formed by depositing a layer of tantalum which is etched to define the anode, followed by anodization of a portion of the layer to form the capacitor dielectric. The capacitor counter-electrode is then formed over the dielectric by depositing and patterning layers which are typically nickel-chromium and gold. These steps are performed in a variety of combinations in order to achieve maximum processing efficiency and compatibility between the components. (See, e.g. U.S. Pat. No. 3,607,679, issued to Melroy et al and U.S. Pat. No. 3,718,565, issued to Pelletier.)

At some point in the processing, it is necessary to stabilize the resistor films by heating in an oxidizing atmosphere. In prior art processes, this step was usually performed prior to completion of the capacitors, otherwise the capacitor dielectric would be degraded resulting in excessive leakage currents. While prior art processes were adequate, the stabilization problem in part necessitated a departure from an optimized sequence which would involve formation of all resistors and capacitors followed by stabilization. In cases where stabilization was prescribed after all resistors and capacitors were formed, the capacitor dielectric had to be formed with a high voltage anodization to insure no degradation (see, U.S. Pat. No. 4,251,326, issued to F. R. Arcidiacono, et al.

The problem of stabilization has recently been exacerbated by the need to further miniaturize thin film components to conserve space. This is especially important where thin film resistors and capacitors are formed over a silicon substrate including active silicon devices. In such circuits, capacitors should be anodized at low voltages less than 100 volts to form a very thin dielectric (less than 1700 Angstroms) in order to achieve high capacitance density. Such thin dielectrics cannot stand up to the high temperatures and times required to stabilize the resistors (typically 350 degrees C. for one hour). However, it appears that the fabrication technique may not be economically attractive unless both the resistors and capacitors can be formed completely prior to stabilization.

It is therefore an object of the present invention to provide a stabilization process which would permit prior complete formation of resistors and capacitors so that processing is optimized. It is a further object of the invention to provide a stabilization process which is compatible with both thin film resistors and low voltage anodization thin film capacitors.

SUMMARY OF THE INVENTION

These and other objects are achieved in accordance with the invention which is a method for fabricating a thin film circuit on an insulating substrate. A thin film resistor and a thin film capacitor are formed on the substrate. After complete formation of such components, stabilization is effected by heating in an atmosphere comprising high pressure steam. Such an atmosphere permits stabilizing the resistors at a sufficiently low temperature and/or time so as not to significantly adversely affect capacitor performance.

BRIEF DESCRIPTION OF THE DRAWING

These and other features will be delineated in detail in the following description. In the drawing.

DETAILED DESCRIPTION

The invention will be discussed with reference to the fabrication of an RC circuit, a portion of which is shown in FIGS. 1-6. It will be realized that the resistor and capacitor are part of a larger circuit which includes other elements. In the case of RC components formed over a silicon wafer, such additional elements would include active devices within a silicon substrate which are omitted here for the sake of generality.

The sequence of steps illustrated is basically that described in U.S. Pat. No. 4,251,326 issued to Arcidiacono, et al, cited supra, for forming RC components on ceramic substrates. It will be appreciated that the invention is not limited to this particular RC fabrication sequence.

First, a layer, 11, of alpha tantalum was formed on an insulating substrate 10. The substrate can be the standard ceramic substrate of conventional RC circuits or an insulating layer overlying an active silicon substrate. The layer 11 was deposited by RF sputtering to a thickness of approximately 3000 Angstroms. Thicknesses in the range 2000–4000 Angstroms are typical. The layer had a nitrogen doping of approximately 30 atomic percent.

Figure 1:
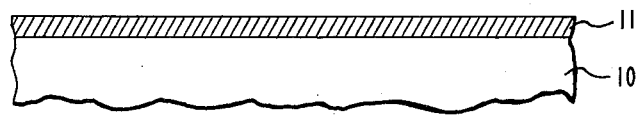
FIGS. 1-6 are cross-sectional views of a portion of a thin film circuit in various stages of fabrication in accordance with one embodiment of the invention.
Figure 2:
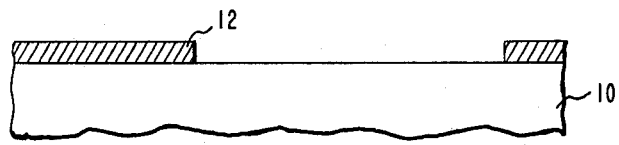

Next, as shown in FIG. 2, the tantalum layer was formed into a pattern, which included a capacitor anode portion 12. This was accomplished by standard photolithographic techniques.

Figure 3:
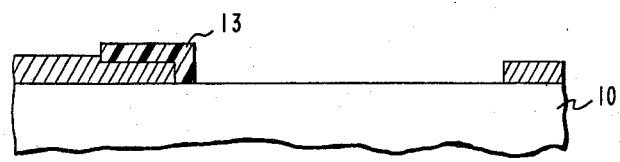

Then, as shown in FIG. 3, fabrication of the capacitors continued by selectively oxidizing a portion of the anode to give a layer, 13, of $Ta_2O_xN_y$. The oxide can be formed using a suitable mask (not shown) such as photoresist or titanium and oxidizing electrolytically in a solution such as 0.01 percent phosphoric or citric acid. With an applied voltage of 50 volts oxide thicknesses were typically 850 Angstroms.

Figure 4:
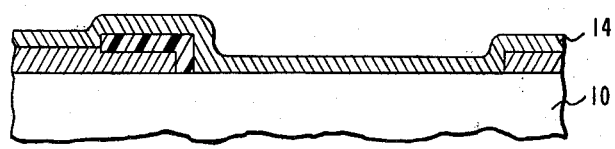
Figure 5:
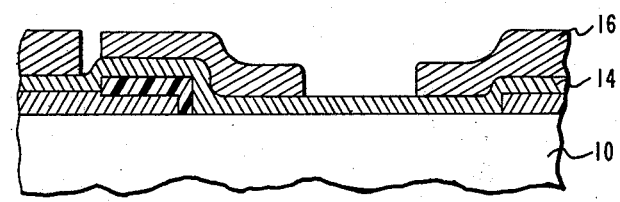

Next as shown in FIG. 4, a layer, 14, comprising tantalum nitride was deposited over the circuit by magnetically enhanced sputtering. The layer was typically 400 Angstroms thick. The capacitor counter-electrode and electrical interconnections were formed by depositing successive layers of titanium, palladium, and gold, shown as composite layer 16, and etching the appropriate patterns as shown in FIG. 5. The thicknesses of the metal layers were typically 2000 Angstroms for titanium, 2500 Angstroms for palladium, and 20,000 Angstroms for gold. Subsequent to defining these electrodes and interconnects, the resistors, 15, were patterned using standard techniques.

Figure 6:
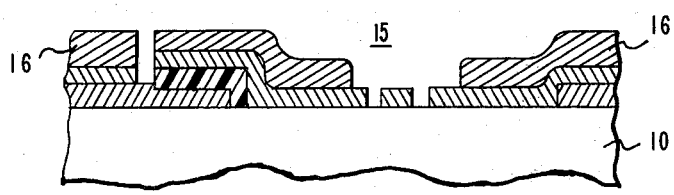
Figure 7:
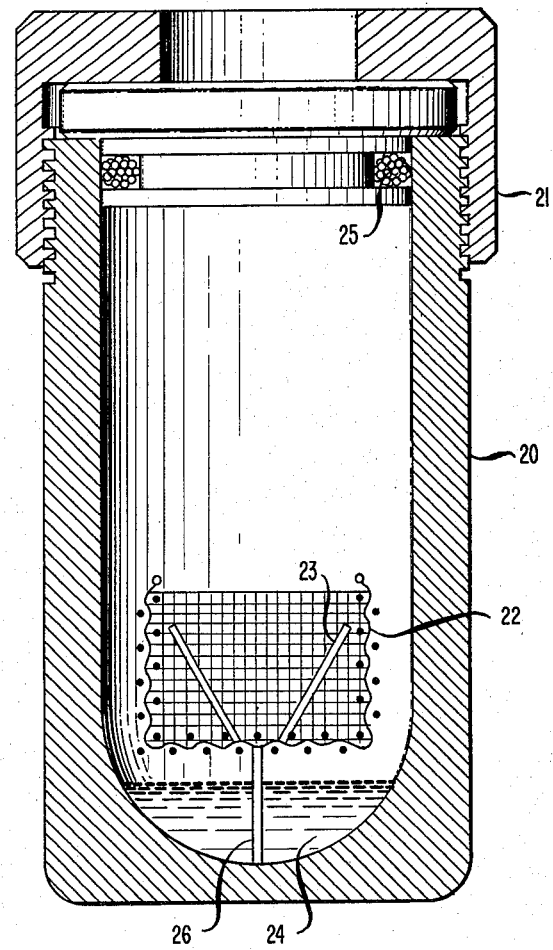
FIG. 7 is a cross-sectional view of an apparatus useful for practicing one embodiment of the invention.

The circuit of FIG. 6 was then subject to a stabilization process in accordance with the invention. FIG. 7 illustrates a typical apparatus which was employed to practice the method. The apparatus is a commercially available reactor sold by Koehler under the designation "oxidation stability bomb." The reactor comprises a cylindrical casing, 20, and a screw-on cover, 21, made of stainless steel and capable of withstanding pressures of 2500 psi. The circuits 23 were placed in a nichrome basket, 22, which was supported by wire support 26. Deionized water, 24, was included in the bottom of the reactor. An O-ring, 25, formed a pressure seal for the reactor.

In subsequent stability runs, a similar apparatus sold by Parr Instrument Company under the designation "General Purpose Bomb No. 4602" was utilized. This particular apparatus would probably be advantageous in commercial manufacture since it included pressure fittings to facilitate temperature and pressure measurements as well as an electric heater with temperature control in which the bomb was inserted. In any event, it should be apparent that the apparatus in FIG. 7 is merely illustrative and any reactor which is capable of withstanding high pressure may be utilized.

In accordance with one embodiment of the method of the invention, sufficient water was added to the reactor to insure saturation at the particular stabilization temperature employed. The amount of water needed for saturation can be determined from tables available in the literature. For example, Keenan and Keyes, Thermodynamic Properties of Steam (First Ed., John Wiley and Sons) at pages 28–33 contains tables showing the specific volume of water which will saturate at various temperatures. Knowing this and the volume of the reactor, the minimum weight of water needed for saturation can be calculated. In this particular example, the volume of the reactor was 190 cm$^3$ and the amount of water added for a 300 degree stabilization was 30 cm$^3$.

After the water was added, the circuits were loaded into the basket, and the reactor was sealed and placed in a standard forced convection air oven heated to the desired stabilization temperature. Temperatures for different runs ranged from 250–350 degrees C. and times ranged from $\frac{1}{2}$–30 hours. In this particular example, the temperature was approximately 300 degrees C. and time of stabilization was approximately one hour. (Times specified herein do not include a period of approximately 50 minutes required for the circuit to reach the stabilization temperature.) The pressure in the reactor at such temperature reached approximately 1246 psi. At temperatures of 250–350 degrees C., pressures will range from approximately 590–2400 psi. Temperatures, times, and pressures outside the ranges given above might be employed if desired for certain applications. For best results, stabilization should be at the minimum time and temperature which will stabilize the resistors so that capacitors are not degraded. For resistance changes of approximately 100 percent during stabilization, 300 degrees C. for one hour appears optimum. A preferred range appears to be 250–350 degrees C. for 10 min-20 hours to achieve resistance changes within the range 50–200 percent during stabilization.

Subsequent to stabilization, the circuits were annealed at 100 degrees C. for approximately 4 hours. This step is not essential, but may be useful for obtaining optimum resistance aging characteristics. Useful annealing ranges are 85–120 degrees C. for 15 min-10 hours.

Figure 8:
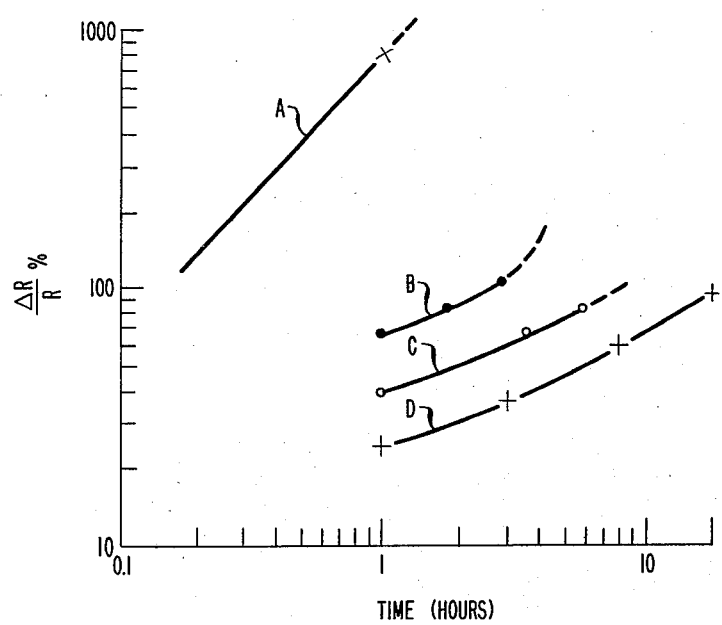
FIG. 8 is a graph of resistance change as a function of time for various stabilization conditions in accordance with the invention.

Resistance values of individual resistors having an initial value of 150Ω/□ and stabilized by the above method were measured. The results are illustrated in the graph of FIG. 8 which shows resistance change as a function of time for resistors stabilized at 350 degrees C. (Curve A), 300 degrees C. (Curve B), 275 degrees C. (Curve C) and 250 degrees C. (Curve D). It was discovered that these resistance change curves were roughly parallel to those of other resistors stabilized in air except they were displaced by approximately 50 degrees C. Thus, for example, resistors stabilized at 300 degrees C. for one hour in steam showed approximately the same resistance changes as resistors stabilized at 350 degrees C. for one hour in air. This displacement is apparently due to an accelerated oxidation rate in the high pressure steam atmosphere which is approximately six times faster than the rate in air at the same temperature.

Figure 9:
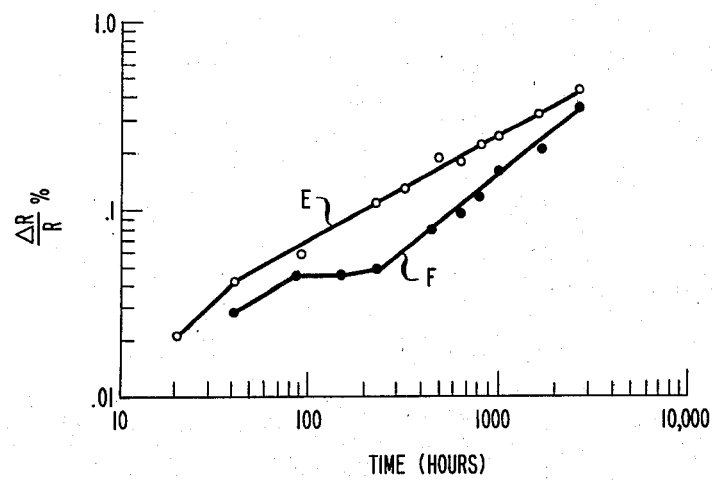
FIG. 9 is a graph of resistance change as a function of resistor aging time for prior art thermally stabilized resistors compared to resistors stabilized in accordance with one embodiment of the invention.

Resistors stabilized in steam were also thermally aged subsequent to stabilization to determine resistance changes. Initial resistance value was 300Ω/□. FIG. 9 shows thermal aging effects for a resistor stabilized at 300 degrees C. for one hour in steam in accordance with the invention (Curve E) compared with a resistor stabilized at 350 degrees C. for one hour in air (Curve F). Both resistors were aged at 150 degrees C. It will be noted again that the curves are roughly parallel, but the initial resistance change for steam stabilized resistors was larger. This initial resistance change can be decreased by annealing subsequent to the steam stabilization as previously described. Even without an annealing step, the aging of the steam stabilized resistors is still less than 0.1 percent at 65 degrees C. for 20 years. Thus, although aging of steam stabilized resistors is different from air stabilized resistors, change in resistance is well within the limit for precision resistors.

Individual capacitors anodized at 50 volts and undergoing stabilization in accordance with the above-described embodiment were tested for capacitance, dissipation factor, and leakage. After approximately 20 hours of storage time, median values were 8170 pf capacitance, 0.0018 dissipation factor and 0.25 nanoamps leakage at 12 volts. Thus, the steam stabilization produced acceptable capacitors. Consequently, one of the important advantages of the inventive method is that it can be used to stabilize resistors and capacitors simultaneously whereas in the standard prior art process, resistors typically had to be stabilized at times and temperatures which would cause capacitor degradation.

While the inventive method has been described with the use of a saturated steam environment in accordance with one embodiment, one could reduce the humidity if desired. Resistance characteristic curves will be essentially like those of FIG. 8 but displaced. For example, at 300 degrees C. a resistance change produced in saturated vapor in one hour took 1.5 hours in 50 percent relative humidity and 4 hours in 25 percent relative humidity. Further, although steam alone was described, other materials such as oxygen might be added to the stabilization environment.

Various additional modifications will become apparent to those skilled in the art. All such variations which basically rely on the teachings through which the invention has advanced the art are properly considered within the spirit and scope of the invention.

I claim:

1. A method for fabricating a thin film circuit on an insulating substrate (10) comprising the steps of forming a thin film resistor (15) and thin film capacitor (12, 13, 14, 16) on said substrate; and stabilizing the resistor and capacitor by heating in an oxidizing atmosphere CHARACTERIZED IN THAT the resistor and capacitor are simultaneously stabilized by heating in an atmosphere comprising steam at a temperature within the range 250-350 degrees C. for a time within the range 10 min.-20 hours and a pressure within the range 590-2400 psi.

2. The method according to claim 1 wherein the capacitor is formed by forming an electrode (12) on said substrate, oxidizing a portion of the electrode by anodizing at a voltage of no greater than 100 volts to form the capacitor dielectric (13), and forming a capacitor counter-electrode (16) over said dielectric.

3. The method according to claim 1 wherein the atmosphere is saturated with steam.

4. The method according to claim 1 wherein the resistor comprises tantalum nitride and the capacitor comprises an anode of tantalum, a dielectric of tantalum oxide, and a counter-electrode of successive layers of titanium, palladium and gold.

5. The method according to claim 4 wherein the resistor and capacitor are heated to a temperature of approximately 300 degrees C. for approximately one hour.

6. A method for fabricating a thin film circuit on an insulating substrate (10) comprising the steps of: forming a thin film resistor (15) on said substrate; forming a thin film capacitor on said substrate by forming an electrode (12) on said substrate, oxidizing a portion of the electrode by anodizing at a voltage no greater than 100 volts to form the capacitor dielectric (13), and forming a capacitor counter-electrode (16) over said dielectric; and stabilizing the resistor and capacitor by heating in an oxidizing atmosphere, CHARACTERIZED IN THAT the resistor and capacitor are simultaneously stabilized by heating in an atmosphere comprising steam at a temperature within the range 250-350 degrees C. for a time within the range 10 min-20 hours and a pressure within the range 590-2400 psi.

* * * * *